US008131340B2

(12) United States Patent
Eberlein et al.

(10) Patent No.: US 8,131,340 B2
(45) Date of Patent: Mar. 6, 2012

(54) DETECTOR UNIT FOR ARRANGEMENT WITHIN A FIELD GENERATING UNIT OF AN MR DEVICE

(75) Inventors: Eva Eberlein, Baiersdorf (DE); Ludwig Eberler, Postbauer-Heng (DE); Andreas Krug, Fürth (DE); Razvan Lazar, Erlangen (DE); Jürgen Nistler, Erlangen (DE); Wolfgang Renz, Erlangen (DE); Axel vom Endt, Newton, MA (US)

(73) Assignee: Siemens Aktiengesellschaft, Munich (DE)

( * ) Notice: Subject to any disclaimer, the term of this patent is extended or adjusted under 35 U.S.C. 154(b) by 352 days.

(21) Appl. No.: 12/441,974

(22) PCT Filed: Sep. 19, 2007

(86) PCT No.: PCT/EP2007/059868
§ 371 (c)(1),
(2), (4) Date: Mar. 19, 2009

(87) PCT Pub. No.: WO2008/037636
PCT Pub. Date: Apr. 3, 2008

(65) Prior Publication Data
US 2010/0036237 A1 Feb. 11, 2010

(30) Foreign Application Priority Data
Sep. 26, 2006 (DE) .......................... 10 2006 045 427

(51) Int. Cl.
*A61B 5/05* (2006.01)
(52) U.S. Cl. ................... 600/411; 600/407; 600/436
(58) Field of Classification Search .................... 600/411
See application file for complete search history.

(56) References Cited

U.S. PATENT DOCUMENTS

| 4,939,464 | A | * | 7/1990 | Hammer ........................ 324/318 |
| 5,646,531 | A | | 7/1997 | Renz |
| 5,696,449 | A | | 12/1997 | Boskamp |
| 5,952,830 | A | * | 9/1999 | Petropoulos et al. ......... 324/318 |
| 6,037,773 | A | * | 3/2000 | Mitsumata et al. ........... 324/318 |
| 6,060,883 | A | | 5/2000 | Knuttel |
| 6,591,127 | B1 | | 7/2003 | McKinnon |
| 6,946,841 | B2 | * | 9/2005 | Rubashov ..................... 324/318 |
| 7,012,431 | B2 | | 3/2006 | Nistler |
| 7,218,112 | B2 | * | 5/2007 | Ladebeck et al. ............. 324/318 |
| 7,286,867 | B2 | * | 10/2007 | Schlyer et al. ................. 600/407 |
| 7,323,874 | B2 | * | 1/2008 | Krieg et al. ................... 324/318 |

(Continued)

OTHER PUBLICATIONS

"Simulation of Scattering and Attenuation of 511 keV Photons in a Combined PET/Field-Cycled MRI System," Handler et al., Physics in Medicine and Biology, vol. 50 (2006), pp. 2479-2491.

(Continued)

*Primary Examiner* — Long V Le
*Assistant Examiner* — Bradley Impink
(74) *Attorney, Agent, or Firm* — Schiff Hardin LLP

(57) ABSTRACT

A detector unit for arrangement in a field generating unit of a magnetic resonance device has an RF transmission/reception system for transmitting RF pulses into, or receiving magnetic resonance signals from, an examination volume of the field generation unit. The RF transmission/reception system surrounds a patient tunnel at a radial distance from a tunnel axis thereof, and is divided into two sub-systems located at a distance from each other along the direction of the tunnel axis, so as to form a substantially annular cavity or interstice therebetween.

31 Claims, 4 Drawing Sheets

U.S. PATENT DOCUMENTS

| | | | |
|---|---|---|---|
| 7,522,952 B2 * | 4/2009 | Krieg et al. | 600/411 |
| 7,626,389 B2 * | 12/2009 | Fiedler et al. | 324/309 |
| 7,667,457 B2 * | 2/2010 | Linz et al. | 324/307 |
| 7,719,277 B2 * | 5/2010 | Eberler et al. | 324/318 |
| 7,728,590 B2 * | 6/2010 | Eberler et al. | 324/318 |
| 7,835,782 B2 * | 11/2010 | Cherry et al. | 600/411 |
| 7,847,552 B2 * | 12/2010 | Haworth et al. | 324/318 |
| 8,013,607 B2 * | 9/2011 | DeMeester et al. | 324/318 |
| 2002/0073717 A1 | 6/2002 | Dean et al. | |
| 2008/0284428 A1 * | 11/2008 | Fiedler et al. | 324/307 |
| 2011/0121832 A1 * | 5/2011 | Shvartsman et al. | 324/318 |

OTHER PUBLICATIONS

"Genetic Algorithms of MRI Magnet Design," Shaw et al., IEEE Trans. on Applied Superconductivity, vol. 12, No. 1 (2002) pp. 733-736.

* cited by examiner

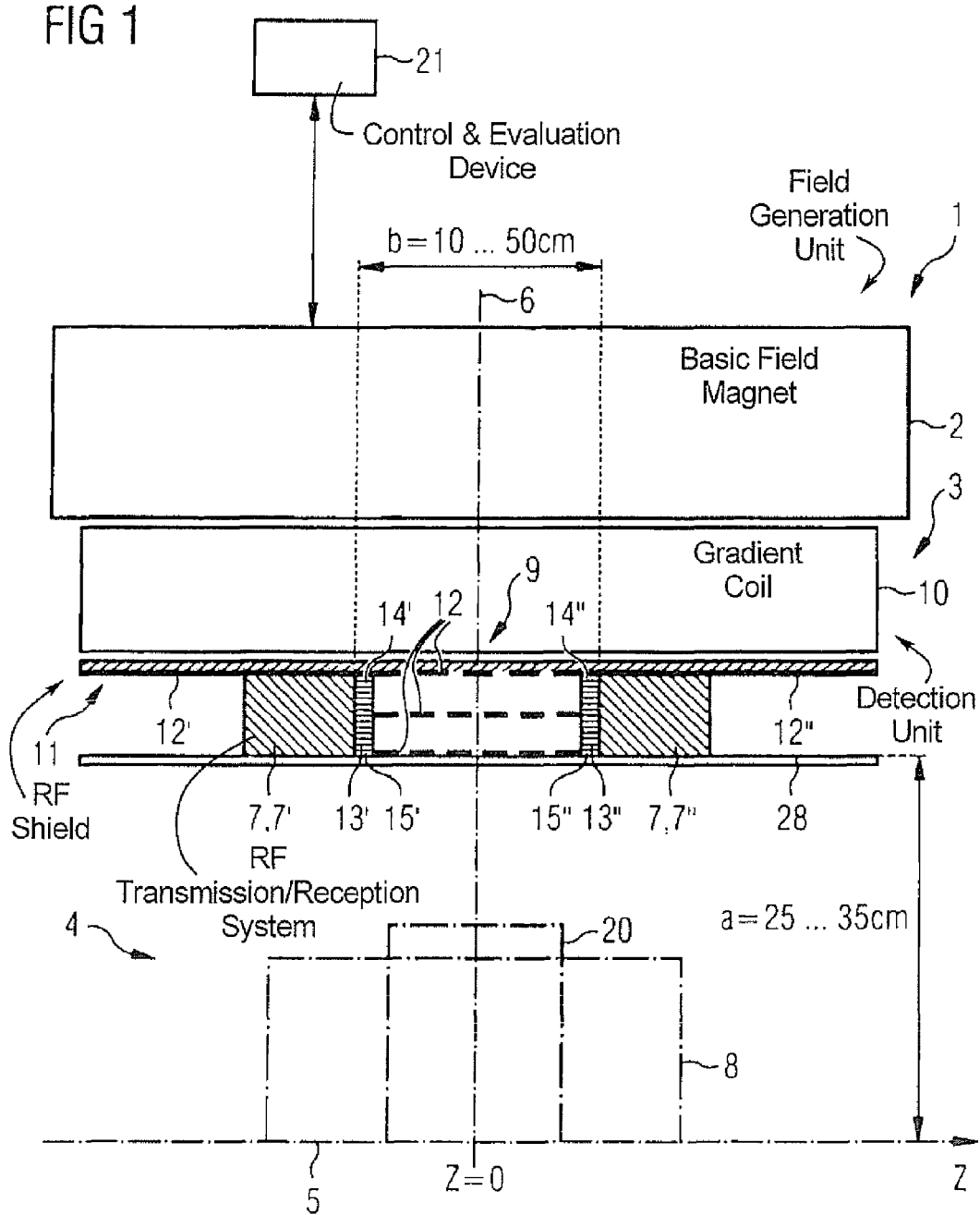

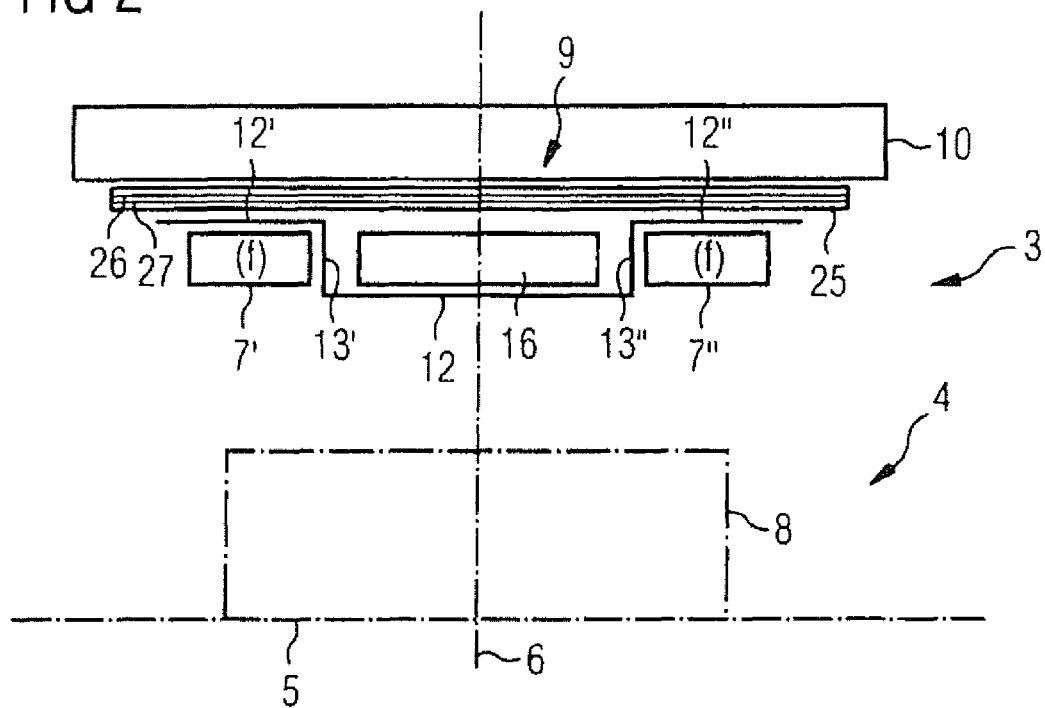
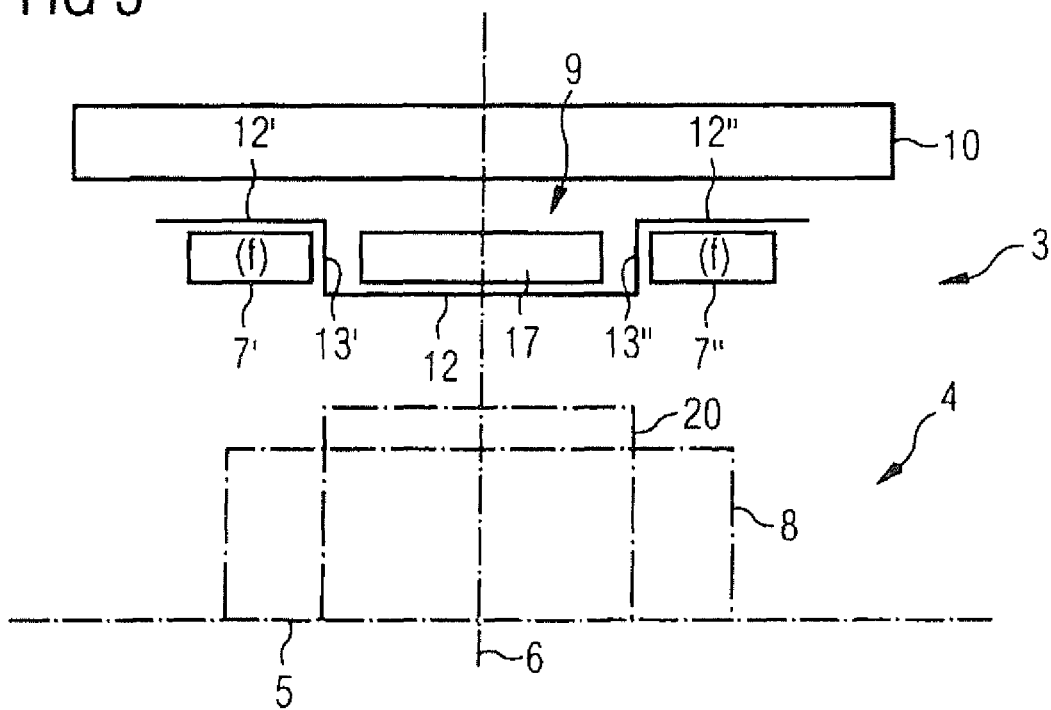

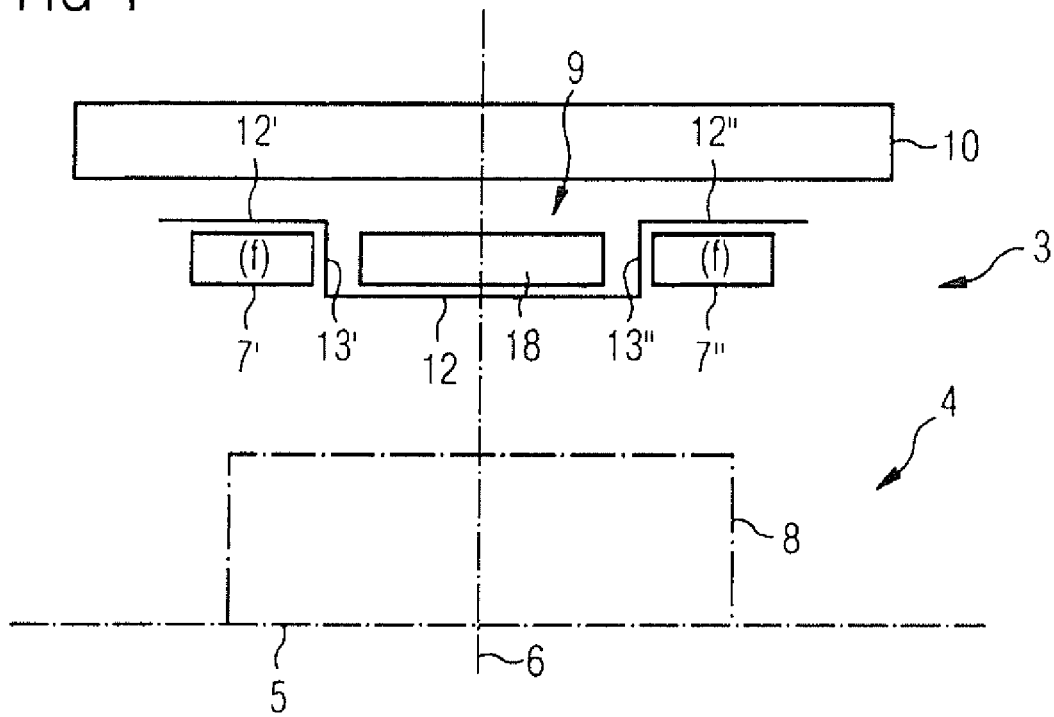
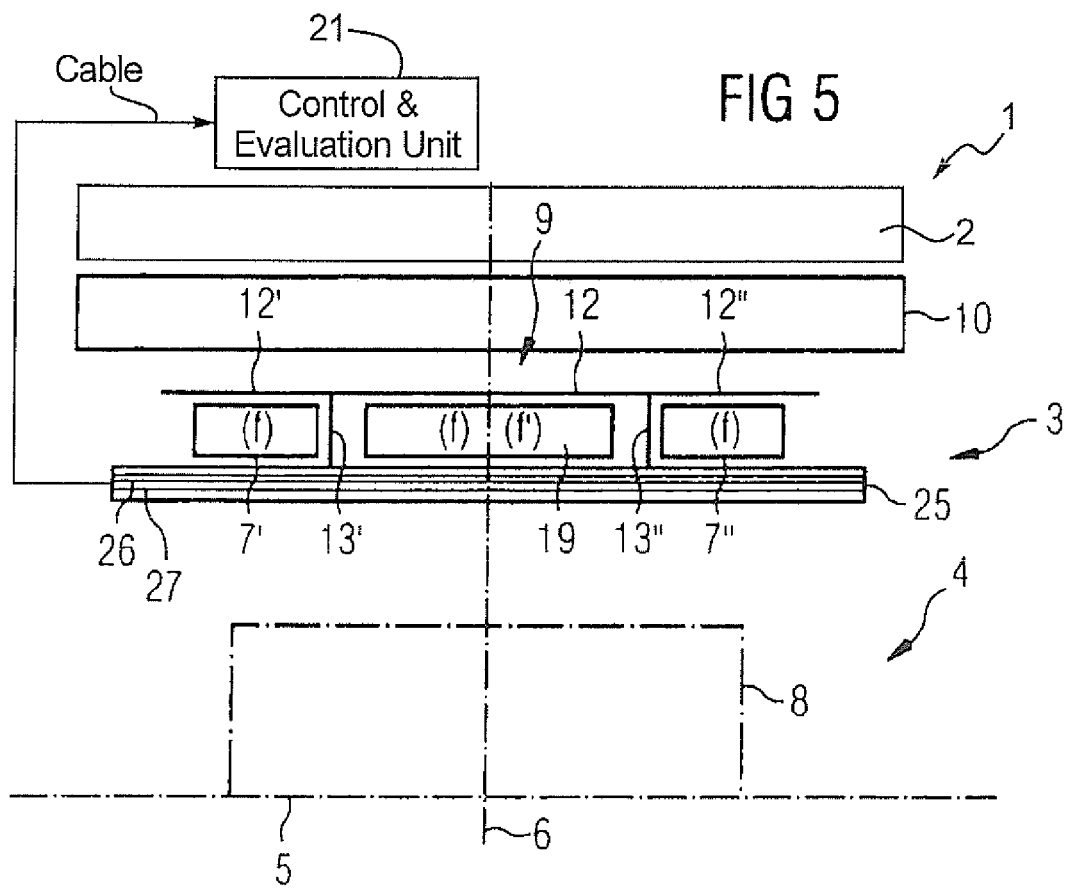

DETECTOR UNIT FOR ARRANGEMENT WITHIN A FIELD GENERATING UNIT OF AN MR DEVICE

BACKGROUND OF THE INVENTION

1. Field of the Invention

The present invention concerns a detection unit for arrangement in a field generation unit of an MR apparatus, of the type wherein the detection unit has an RF transmission/reception system to transmit RF pulses and/or to receive MR signals, wherein the RF transmission/reception system surrounds a patient tunnel at a radial distance from a tunnel axis of the patient tunnel.

2. Description of the Prior Art

Such detection units are generally known.

MR systems, i.e. systems that detect magnetic resonance signals, normally have a detection unit of the type described above, in addition to a basic magnet and a gradient magnet system. The basic magnet generates a static, essentially homogeneous basic magnetic field in an examination volume. The gradient magnet system normally has multiple gradient coils. The basic magnetic field is momentarily varied in a spatially dependent manner by means of the gradient coils of the gradient magnet system. A spatial coding by means of the gradient coils ensues in the excitation of magnetic resonances, which are excited by RF pulses emitted by the RF transmission/reception system. Frequency and phase coding also ensue in the acquisition of the signals resulting from excited magnetic resonances.

The basic magnet, the gradient magnet system and the detection unit are normally concentrically arranged. The basic magnet tangentially extends around the tunnel axis, and extends over a relatively long section as viewed in the direction of the tunnel axis. The gradient magnet system is radially arranged within basic magnet. The radio-frequency transmission/reception system is radially arranged within the gradient system.

Due to the concentric arrangement of the individual components, the tunnel diameter of the patient opening is relatively small. In the prior art the diameter is even further limited by each additional component. This applies independent of whether the additional component is arranged radially within the radio-frequency transmission/reception system (also called a whole-body system in the following) or radially outside of the RF transmission/reception system. Examples of such additional components are special gradient coils (not always used), additional RF systems, PET detectors (positron emission tomography detectors) etc.

SUMMARY OF THE INVENTION

An object of the present invention is to provide a detection unit in which, while still affording the possibility to use such additional components, results in no reduction of the effective tunnel diameter.

Starting from a detection unit of the aforementioned type, the object is achieved by designing the radio-frequency transmission/reception system so as to be divided into two sub-systems, and arranging the two sub-systems to be spaced apart from one another as viewed in the direction of the tunnel axis, so that they form an essentially annular interstice between them.

Additional components can be arranged as necessary in the interstice, for example the components mentioned above.

The detection unit normally has an RF shield that radially outwardly shields the RF transmission/reception system. The RF shield has two sub-system segments and an interstice segment. Viewed in the direction of the tunnel axis, the sub-system segments respectively cover one of the sub-systems, and the interstice segment at least partially overlaps the interstice segment. The interstice segment adjoins the sub-system segments in an RF-sealed (RF-tight) manner, as viewed in the direction of the tunnel axis. The RF shield advantageously has two rings extending in the radial direction relative to the tunnel axis, the radially outer ends of these rings adjoining the ends of the sub-system segments that axially face toward one another relative to the tunnel axis.

The interstice segment in this case borders the rings. Alternatively, it can border the radially outer ends of the rings, the radially inner ends of the rings, or can be between the radially inner ends and the radially outer ends.

For example, an additional radio-frequency transmission/reception system (for example an array antenna) can be arranged in the interstice, radially within the interstice segment. This embodiment is advantageously resorted to in combination with an embodiment in which the interstice segment does not adjoin the radially inner ends of the rings.

The additional radio-frequency transmission/reception system (also called an auxiliary system in the following) is tuned to the same frequency as or, respectively, a different frequency than the sub-systems. In both cases the auxiliary system can be operated simultaneously with at least one of the sub-systems.

Alternatively, it is possible to arrange an auxiliary element in the cavity that optimizes the static basic magnetic field generated by the basic magnet, so as to be radially outside of the interstice segment. This embodiment is advantageously used with an embodiment in which the interstice segment does not adjoin the radially outer ends of the rings.

Alternatively, a PET detector can be arranged in the interstice, radially outside of the interstice segment. This measure is also advantageously taken with an embodiment of the RF shield in which the interstice segment does not radially adjoin the radially outer ends of the rings.

If a PET detector is present, it can advantageously be operated simultaneously with the RF transmission/reception system. The duration of a data acquisition can thereby be reduced overall.

A PET signal that originates from a first volume region can be detected by means of the PET detector. The magnetic resonance signal that can be detected by means of the RF transmission/reception system originates from a second volume region. The first and second volume regions advantageously overlap or are congruent with one another.

In a preferred embodiment, the sub-systems are fashioned as semi-birdcage resonators that each have a ferrule (end ring) circulating around the tunnel axis and, beginning at the respective ferrule, antenna rods extending axially toward one another relative to the tunnel axis. In this case the antenna rods are advantageously connected with the RF shield at their ends facing away from the respective ferrule.

The radio-frequency transmission/reception system is normally radially outwardly surrounded by a gradient coil relative to the tunnel axis. The gradient coil can in particular extend axially (relative to the tunnel axis) on both sides beyond the sub-systems.

The gradient coil can be arranged radially outside of the interstice, and an auxiliary element to optimize a gradient field that can be generated by the gradient coil can be arranged in the interstice, radially outside of the interstice segment. Alternatively, the gradient coil can radially dip into the interstice outside of the interstice segment. These measures are advantageously combined with an embodiment of the RF shield in which the interstice segment does not adjoin the radially outer ends of the rings.

Sub-systems can preferably be operated simultaneously so that they generate an essentially homogeneous RF field in the patient tunnel along the tunnel axis, at least in the region of the interstice. Alternatively or additionally, however, the sub-systems can also be operated independent of one another, in particular individually.

The detection unit is advantageously designed symmetrically relative to a plane orthogonal to the tunnel axis. Field that are especially homogeneous can be generated.

In practice it has proven to be advantageous when the sub-systems have an axial separation that, viewed in the direction of the tunnel axis, is between 10 and 50 cm. The axial separation can in particular be between 20 and 30 cm.

The sub-systems are normally mounted on a support tube. The installation can in particular be detachable. The sub-systems can alternatively be mounted radially inward or radially outward on the support tube.

It is possible to integrate a cooling system for cooling of at least one element connected with the support tube into said support tube. A more compact design of the detection unit thereby results.

For the same reason it can be advantageous when cables are integrated into the support tube for electrical connection of at least one element connected with the support tube with a control and/or evaluation device external to the detection unit.

The detection unit according to the invention can in particular be used in a field generation unit of a magnetic resonance system.

BRIEF DESCRIPTION OF THE DRAWINGS

FIG. 1 schematically illustrates a field generation unit with a detection unit in accordance with the present invention.

FIGS. 2 through 5 respectively show different embodiments of the detection unit of FIG. 1.

DESCRIPTION OF THE PREFERRED EMBODIMENTS

Figure 6:
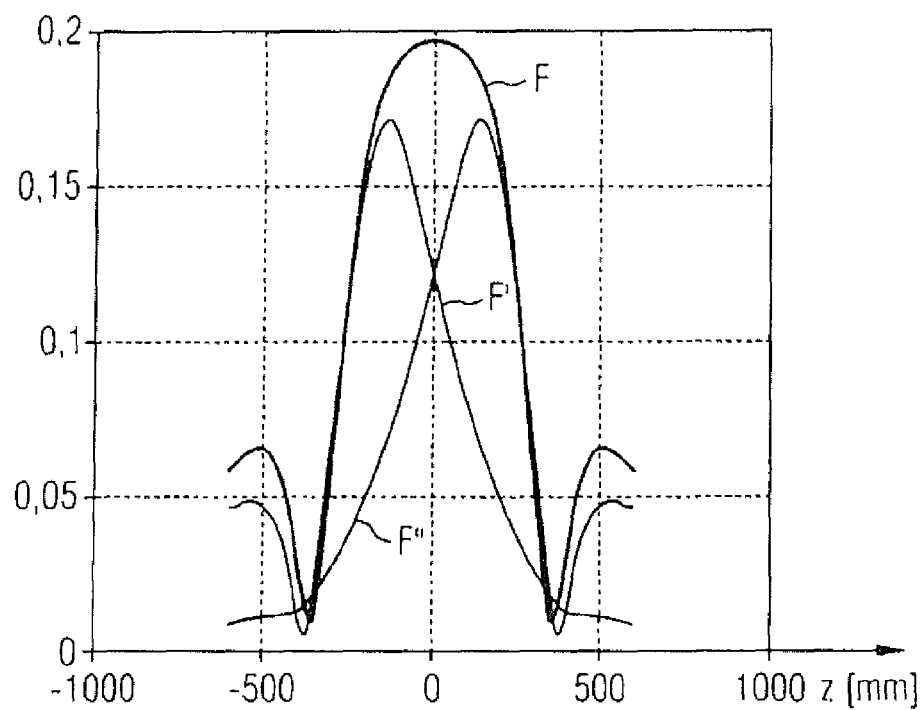
FIG. 6 is a field strength curve for the field strength generated in the detection unit in accordance with the present invention.

According to FIG. 1, a magnetic resonance system (MR system for short in the following) possesses a field generation unit 1. The field generation unit 1 possesses a basic field magnet 2 and a detection unit 3. Both the basic field magnet 2 and the detection unit 3 are essentially fashioned as cylinders, such that they form an essentially cylindrical patient tunnel 4.

The patient tunnel 4 has a tunnel axis 5. Both the basic field magnet 2 and the detection unit 3 are symmetrically arranged relative to a plane of symmetry 6 which orthogonally intersects the tunnel axis 5.

Insofar as the terms "axial", "radial" and "tangential" are used in the following, they are always relative to the tunnel axis 5. Axial means a direction parallel to the tunnel axis 5. Radial means a direction perpendicular to the tunnel axis 5 and towards or, respectively, away from the tunnel axis 5. Tangential designates a direction around the tunnel axis 5. The directions are orthogonal to one another.

The detection unit 3 is arranged in the field generation unit 1. It possesses a radio-frequency (RF) transmission/reception system 7, also designated in the following as a whole-body system 7. RF pulses can be emitted by means of the whole-body system 7. An examination subject (not shown) can be excited by means of the RF pulses to emit magnetic resonance signals when it is located in an examination region 8 at the point in time of the transmission of the RF pulses. The examination region 8 is essentially cylindrical and rotationally symmetrical relative to the tunnel axis and mirror-symmetrical relative to the plane of symmetry 6. The magnetic resonance signals can also be received by means of the whole-body system 7.

The whole-body system 7 surrounds the tunnel axis 5 at a radial distance a. The radial distance a is most often 25 to 35 cm, for example 30 cm.

According to FIG. 1 the whole-body system 7 is divided up into two sub-systems 7', 7". The two sub-systems 7', 7" are axially (viewed in the direction of the tunnel axis 5) spaced apart from one another so that they form an essentially annular interstice 9 between them. An axial distance b of the sub-systems 7', 7" from one another is normally between 10 and 50 cm, in particular between 20 and 30 cm.

A gradient coil 10 is radially arranged between the basic field magnet 2 and the whole-body system 7. The whole-body system 7 is thus radially outwardly surrounded by the gradient coil 10. According to FIG. 1, the gradient coil 10 extends axially on both sides beyond the sub-systems 7', 7". In particular, the gradient coil 10 is also arranged symmetrical to the plane of symmetry 6.

The whole-body system 7 is normally radially outwardly shielded against RF radiation. For this purpose the detection unit 3 has an RF shield 11 that radially outwardly shields the whole-body system 7. In the present case, the RF shield 11 has an interstice segment 12 and two sub-system segments 12', 12". Viewed in the direction of the tunnel axis 5, the sub-system segments 12', 12" respectively cover one of the sub-systems 7', 7". The interstice segment 12 at least partially covers the interstice segment 9. Viewed in the direction of the tunnel axis 5, the interstice segment 12 adjoins the sub-system segments 12' 12" in an RF-sealed manner. This applies independent of the precise axial position at which the adjoining ensues.

In the present case, the RF shield 11 possesses two rings 13', 13" that extend in the radial direction. The rings 13', 13" therefore has radially outward ends 14', 14" and radially inward ends 15', 15". The radially outer ends 14', 14" adjoin ends of the sub-system segments 12', 12" that are axially facing towards one another. Each sub-system segment 12', 12", together with the ring 13', 13" adjoining it, thus forms an L-shaped structure in the section representation of FIG. 1. The sub-systems 12', 12" are therefore RF-shielded not only radially outwardly but also against one another.

The rings 13', 13" simultaneously define the transition region in which the sub-system segments 12', 12" adjoin the interstice segment 12. The region axially located between the rings 13', 13" (i.e. the interstice 9) is therefore RF-shielded against both sub-systems 12', 12".

Depending on the application case, an arrangement of the interstice segment 12 at a different radial distance from the tunnel axis 5 is reasonable. For some applications, it can be useful when the interstice segment 12 adjoins the radially outer ends 14', 14" of the rings 13', 13". For other applications it can be reasonable when the interstice segment 12 adjoins the radially inner ends 15', 15" of the rings 13'. 13". It can also possibly be useful to arrange the interstice segment 12 at a radial distance that lies between these two extreme positions. In this case the interstice segment 12 adjoins the rings 13', 13" radially (relative to the tunnel axis 5) between the radially inner and the radially outer ends 15', 15", 14', 14".

The three possible arrangements of the interstice segment 12 are drawn with dashed lines. The drawing is done in dashed lines because only one of these three positions is provided in one physical realization.

Additional components of the detection unit 3 by means of which the operation of the magnetic resonance system can be optimized in the broadest sense can be arranged in the interstice 9.

For example (see FIG. 2), an auxiliary element 16 by means of which the static basic magnetic field generated by the basic field magnet 2 is optimized can be arranged in the interstice 9. The auxiliary element 16 can alternatively be active or passive. It is normally arranged radially outside of the interstice segment 12.

Alternatively (see FIG. 3), a PET detector 17 can be arranged in the interstice 9. The PET detector 17 is normally likewise arranged radially outside of the interstice segment 12.

Again alternatively (see FIG. 4), an auxiliary element 18 by means of which the gradient field generated by the gradient coil 10 can be optimized can be arranged in the interstice 9. In this case as well the corresponding auxiliary element 18 is advantageously arranged radially outside of the interstice segment 12. Instead of the presence of the auxiliary element 18, the gradient coil 10 itself could alternatively dip into the interstice 9.

Again alternatively (see FIG. 5), an additional radio-frequency transmission/reception system 19 can be arranged in the interstice 9. The additional RF transmission/reception system 19 is subsequently designated as an auxiliary system for short. For example, it can be fashioned as an array antenna.

The auxiliary system 19 is advantageously arranged radially inside the interstice segment 12. Given a corresponding embodiment of the RF shield 11—in particular given arrangement of the interstice segment 12 between the inner and outer ends 15', 15", 14', 14" of the rings 13', 13"—the embodiment of FIG. 5 can also be combined with one of the embodiments of FIGS. 2 through 4.

When the PET detector 17 is present, it can advantageously be operated simultaneously with the whole-body system 7. Alternatively or additionally, it can also be operable as necessary simultaneously with the auxiliary system 19.

A PET signal that originates from a volume region 20 can be detected by means of the PET detector 17. The volume region 20 should coincide as much as possible with the examination region 8. In the ideal case, there is congruence. However, the volume region 20 and the examination region 8 should at least overlap.

The sub-systems 7', 7" are tuned to a specific frequency f, for example the Larmor frequency of hydrogen. When the auxiliary system 19 is present, it can be tuned to the same frequency f. Alternatively, it can be tuned to another frequency f'. In both cases, the auxiliary system 19 can be operated not only alternatively to but also simultaneously with the sub-systems 7', 7" (or simultaneously with at least one of the sub-systems 7', 7").

The sub-systems 7', 7" are advantageously operable both simultaneously with and independent of one another, in particular individually. Which operation ensues in a concrete individual case depends on the control by a control and evaluation device 21 that is arranged outside of the detection unit 3.

FIG. 6 exemplarily shows field strengths F', F" of the respective sub-system 7', 7" that can be achieved as a function of the location z on the tunnel axis 5 when the two sub-systems 7', 7" are operated individually. FIG. 6 furthermore shows an achievable field strength F when the sub-systems 7', 7" are operated simultaneously. As is apparent from FIG. 6, the sub-systems 7', 7" in the patient tunnel 4 generate an essentially homogeneous RF field, at least in the region of the interstice 9 along the tunnel axis 5.

Figure 7:
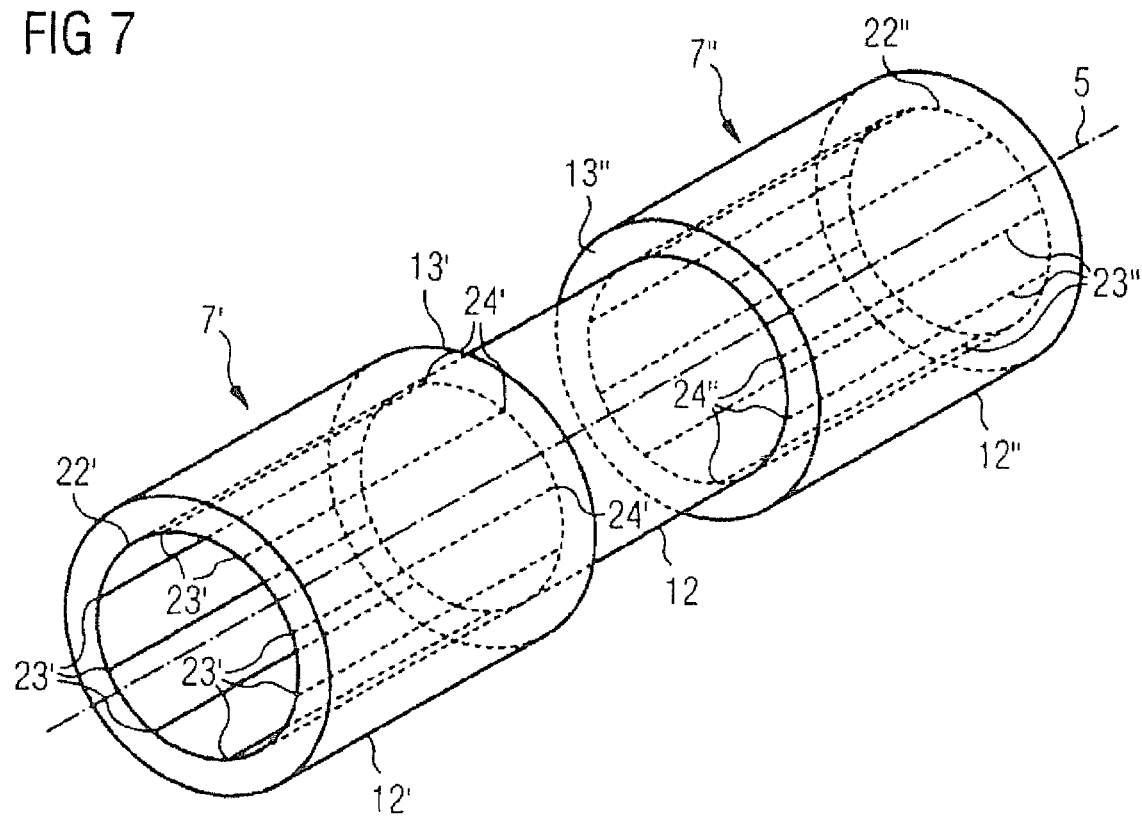
FIG. 7 is a perspective view, in section, of the detection unit of FIG. 1

The curve of the field strength F shown in FIG. 6 can be achieved in various ways. Presently it is preferred to fashion the sub-systems 7', 7" as semi-birdcage resonators corresponding to FIG. 7. In this case, each sub-system 7', 7" possesses a respective ferrule 22', 22" circulating tangentially relative to the tunnel axis 5. Furthermore, the sub-systems 7', 7" respectively possess a number of antenna rods 23', 23". The antenna rods 23', 23" extend axially towards one another, starting from the respective ferrule 22', 22". They possess axial ends 24', 24" that are connected with the RF shield 11, in particular with the respective ring 13', 13".

The sub-systems 7', 7" are normally mounted on a support tube 25. The mounting can be permanent, but it is normally detachable. The sub-systems 7', 7" can alternatively be installed radially inward (see FIG. 2, for example) or radially outward (see FIG. 4, for example) on the support tube 25. The type of installation of the sub-systems 7', 7" is thereby independent of whether (and, if applicable, which) additional components 16 through 19 the detection unit 3 possesses. It is also independent of whether the interstice segment 12 is connected radially inwardly, radially outwardly or (for example) radially centrally with the rings 13', 13".

Additional elements, in particular the auxiliary elements 16, 18, the PET detector 17 and/or the auxiliary system 19 mentioned in the preceding, can be mounted as necessary on the support tube 25.

Conductors can be integrated into the support tube 25. For example, the conductors can include a pipeline 26 of a cooling system by means of which at least one of the elements 7', 7", 16 through 19 connected with the support tube 25 is cooled. Alternatively or additionally, as schematically shown in FIG. 5, one of the conductors can be a cable 27, that also proceeds externally of the field generating unit 1, by means of which at least one of the elements 7', 7", 16 through 19 connected with the support tube 25 is electrically connected with the control and evaluation device 21.

In all cases a covering 28 is present radially inside the sub-systems 7', 7", the RF shield 11 and the additional components 16 through 19 (see FIG. 1). Given radially outward installation of the sub-systems 7', 7" on the support tube 25, the covering 28 can possibly be identical with the support tube 25.

By means of the detection unit 3 designed according to the invention it is possible to arrange additional components 16 through 19 (for example the PET detector 17) without noteworthy limitations in the dimensions of the detection unit 3 that are essentially identical in comparison with a detection unit of the prior art. A large plurality of individual possibilities is thereby provided. Beyond the possibilities explicitly described in the preceding, for example, it would be possible to arrange a light source in the interstice 9,
to arrange a display device in the interstice 9,
to arrange a hyperthermy antenna in the interstice 9,
to arrange optical signal emitters for a functional magnetic resonance imaging (fMRI) in the interstice 9 etc.

Although modifications and changes may be suggested by those skilled in the art, it is the intention of the inventors to embody within the patent warranted heron all changes and modifications as reasonably and properly come within the scope of their contribution to the art.

The invention claimed is:

1. A detection unit configured for arrangement in a field generation unit of a magnetic resonance apparatus, said detection unit comprising:
   a radio-frequency transmission/reception system that transmits RF pulses and/or receives magnetic resonance signals, said radio-frequency transmission/reception system being configured to surround a patient tunnel, having a longitudinal tunnel axis, of the field generation unit at a radial distance from the tunnel axis;
   said radio-frequency transmission/reception system comprising two sub-systems spaced apart from each other along a direction of said tunnel axis and forming a substantially annular interstice between said two sub-systems; and
   a radio-frequency shield that radially outwardly shields said radio-frequency transmission/reception system, said radio-frequency shield comprising two sub-system shield segments and an interstice shield segment disposed successively along said direction of said tunnel axis, said sub-system shield segments respectively covering said sub-systems of said radio-frequency transmission/reception system and said interstice shield segment at least partially covering said interstice in said radio-frequency transmission/reception system, said interstice shield segment adjoining said sub-system shield segments in a radio-frequency-tight configuration along said direction of said tunnel axis, and said radio-frequency shield comprising two rings extending in a radial direction relative to said tunnel axis, said two rings respectively having radially outer ends that respectively adjoin ends of the sub-system shield segments axially facing toward each other along said tunnel axis.

2. A detection unit as claimed in claim 1 wherein said interstices shield segments adjoins the radially outer ends of said rings.

3. A detection unit as claimed in claim 1 wherein said rings respectively also have radially inner ends, and wherein said interstice shield segment adjoins the respective radially inner ends of said rings.

4. A detection unit as claimed in claim 1 wherein said rings respectively also have radially inner ends, and wherein said interstice shield segment adjoins said rings between said radially inner and radially outer ends relative to said tunnel axis.

5. A detection unit as claimed in claim 1 wherein said interstices shield segments adjoins the radially outer ends of said rings, and wherein said radio-frequency transmission/reception system is a first radio-frequency transmission/reception system, and wherein said detection unit further comprises a second radio-frequency transmission/reception system disposed radially within said interstices shield segment in said interstice of said first radio-frequency transmission/reception system.

6. A detection unit as claimed in claim 5 wherein said second radio-frequency transmission/reception system is operable simultaneously with at least one of the sub-systems of said first radio-frequency transmission/reception system.

7. A detection unit as claimed in claim 1 wherein said rings respectively also have radially inner ends, and wherein said interstice shield segment adjoins said rings between said radially inner and radially outer ends relative to said tunnel axis, and wherein said radio-frequency transmission/reception system is a first radio-frequency transmission/reception system, and wherein said detection unit further comprises a second radio-frequency transmission/reception system disposed radially within said interstice shield segment in said interstice of said first radio-frequency transmission/reception system.

8. A detection unit as claimed in claim 7 wherein said second radio-frequency transmission/reception system is operable simultaneously with at least one of the sub-systems of said first radio-frequency transmission/reception system.

9. A detection unit as claimed in claim 1 wherein said rings respectively also have radially inner ends, and wherein said interstice shield segment adjoins the respective radially inner ends of said rings, and wherein said detection unit further comprises an auxiliary element that optimizes a static basic magnetic field generated by a basic magnet of said field generation unit, said auxiliary element being disposed in said interstice radially outside of said interstice shield segment.

10. A detection unit as claimed in claim 1 wherein said rings respectively also have radially inner ends, and wherein said interstice shield segment adjoins said rings between said radially inner and radially outer ends relative to said tunnel axis, and wherein said detection unit further comprises an auxiliary element that optimizes a static basic magnetic field generated by a basic magnet of said field generation unit, said auxiliary element being disposed in said interstice radially outside of said interstice shield segment.

11. A detection unit as claimed in claim 1 wherein said rings respectively also have radially inner ends, and wherein said interstice shield segment adjoins the respective radially inner ends of said rings and wherein said detection unit comprises PET detector disposed in said interstice radially outside of said interstice shield segment.

12. A detection unit as claimed in claim 11 wherein said PET detector is operable simultaneously with said radio-frequency transmission/reception system.

13. A detection unit as claimed in claim 12 wherein said PET detector is configured to detect a PET signal originating from a first volume region in said field examination unit, and wherein said radio-frequency transmission/reception system is configured to detect a magnetic resonance signal originating from a second volume region in said field examination unit, said first volume region and said second volume region at least partially overlapping each other.

14. A detection unit as claimed in claim 1 wherein said rings respectively also have radially inner ends, and wherein said interstice shield segment adjoins said rings between said radially inner and radially outer ends relative to said tunnel axis and wherein said detection unit further comprises a PET detector disposed in said interstice radially outside of said interstice shield segment.

15. A detection unit as claimed in claim 14 wherein said PET detector is operable simultaneously with said radio-frequency transmission/reception system.

16. A detection unit as claimed in claim 15 wherein said PET detector is configured to detect a PET signal originating from a first volume region in said field examination unit, and wherein said radio-frequency transmission/reception system is configured to detect a magnetic resonance signal originating from a second volume region in said field examination unit, said first volume region and said second volume region at least partially overlapping each other.

17. A detection unit as claimed in claim 1 wherein each of said sub-systems is formed as a semi-birdcage resonator having a ferrule extending around said tunnel axis and antenna rods extending axially along said tunnel axis starting from said ferrule, and wherein said antenna rods of each of said sub-systems are connected with said radio-frequency shield at respective ends thereof facing away from the respective ferrule from which they extend.

18. A detection unit as claimed in claim 1 wherein said field examination unit comprises a gradient coil, and wherein said radio-frequency transmission/reception system is disposed, relative to said tunnel axis, radially inwardly of said gradient coil.

19. A detection unit as claimed in claim 18 wherein said sub-systems, along said direction of said tunnel axis, terminate within a termination of said gradient coil along said direction of said tunnel axis.

20. A detection unit as claimed in claim 1 wherein said sub-systems of said radio-frequency transmission/reception system are simultaneously operable to generate a substantially homogenous radio-frequency field in said patient tunnel, at least in a region of said interstice along said tunnel axis.

21. A detection unit as claimed in claim 1 wherein said sub-systems of said radio-frequency transmission/reception system are operable independently of each other.

22. A detection unit as claimed in claim 1 wherein said radio-frequency transmission/reception system is radially symmetrical in a plane that is orthogonal to said tunnel axis.

23. A detection unit as claimed in claim 1 wherein said sub-systems of said radio-frequency transmission/reception system are axially separated from each other along said direction of said tunnel axis, with a separation between 10 and 50 cm.

24. A detection unit as claimed in claim 1 comprising a support tube on which said sub-systems are detachably installed.

25. A detection unit as claimed in claim 24 wherein said sub-systems are installed radially inwardly on said support tube.

26. A detection unit as claimed in claim 24 wherein said sub-systems are installed radially outwardly on said support tube.

27. A detection unit as claimed in claim 25 comprising a cooling system configured to cool at least one component of said field generation unit, said cooling system being connected to said support tube.

28. A detection unit as claimed in claim 25 comprising a cooling system configured to cool at least one component of said field generation unit, said cooling system being integrated into said support tube.

29. A detection unit as claimed in claim 25 comprising a cable providing an electrical connection to at least one component of said field generation unit, said cable being mechanically connected to said support tube and electrically connected to a device that is located externally of said field generation unit.

30. A detection unit configured for arrangement in a field generation unit of a magnetic resonance apparatus, said detection unit comprising:
  a radio-frequency transmission/reception system that transmits RF pulses and/or receives magnetic resonance signals, said radio-frequency transmission/reception system being configured to surround a patient tunnel, having a longitudinal tunnel axis, of the field generation unit at a radial distance from the tunnel axis;
  said radio-frequency transmission/reception system comprising two sub-systems spaced apart from each other along a direction of said tunnel axis and forming a substantially annular interstice between said two sub-systems;
  said field examination unit comprising a gradient coil, and said radio-frequency transmission/reception system being disposed, relative to said tunnel axis, radially inwardly of said gradient coil;
  said gradient coil being disposed radially outside of said interstice; and
  said detection unit comprising an auxiliary element that optimizes a gradient field emitted by said gradient coil, said auxiliary element being disposed radially outside an interstice shield segment in said interstice of said radio-frequency transmission/reception system.

31. A detection unit configured for arrangement in a field generation unit of a magnetic resonance apparatus, said detection unit comprising:
  a radio-frequency transmission/reception system that transmits RF pulses and/or receives magnetic resonance signals, said radio-frequency transmission/reception system being configured to surround a patient tunnel, having a longitudinal tunnel axis, of the field generation unit at a radial distance from the tunnel axis;
  said radio-frequency transmission/reception system comprising two sub-systems spaced apart from each other along a direction of said tunnel axis and forming a substantially annular interstice between said two sub-systems;
  said field examination unit comprising a gradient coil, and said radio-frequency transmission/reception system being disposed, relative to said tunnel axis, radially inwardly of said gradient coil; and
  said gradient coil, radially outside of an interstice shield segment, extending into said interstice of said radio-frequency transmission/reception system.

* * * * *